United States Patent [19]

Groves

[11] 4,011,575
[45] Mar. 8, 1977

[54] LIGHT EMITTING DIODE ARRAY HAVING A PLURALITY OF CONDUCTIVE PATHS FOR EACH LIGHT EMITTING DIODE

[75] Inventor: Henry Tobin Groves, Van Nuys, Calif.

[73] Assignee: Litton Systems, Inc., Beverly Hills, Calif.

[22] Filed: June 3, 1976

[21] Appl. No.: 692,621

Related U.S. Application Data

[63] Continuation of Ser. No. 492,195, July 26, 1974, abandoned.

[52] U.S. Cl. .................................. 357/17; 357/30; 357/32; 357/76; 357/68; 357/80; 361/400; 361/401; 361/410

[51] Int. Cl.² .................. H01L 33/00; H01L 23/48; H01L 29/44; H01L 29/52

[58] Field of Search .................. 357/17, 18, 19, 30, 357/32, 76, 80, 68; 317/101 CC, 101 CP, 101 CE

[56] References Cited

UNITED STATES PATENTS

| | | | |
|---|---|---|---|
| 3,463,970 | 8/1969 | Gutzwiller | 357/76 |
| 3,614,661 | 10/1971 | Borner | 357/76 |
| 3,622,906 | 11/1971 | Nyul | 357/17 |
| 3,783,347 | 1/1974 | Vladik | 357/76 |
| 3,783,353 | 1/1974 | Pankove | 357/17 |
| 3,812,406 | 5/1974 | Henri | 357/17 |
| 3,855,606 | 12/1974 | Schoberl | 357/17 |
| 3,886,581 | 5/1973 | Katsumura et al. | 357/17 |
| 3,950,844 | 4/1976 | Wisbey | 357/17 |

Primary Examiner—Andrew J. James
Attorney, Agent, or Firm—Donald J. Ellingsberg; Norman E. Brunell

[57] ABSTRACT

A light emitting diode (LED) array having a plurality of electrical conductive paths for each LED in the array.

1 Claim, 1 Drawing Figure

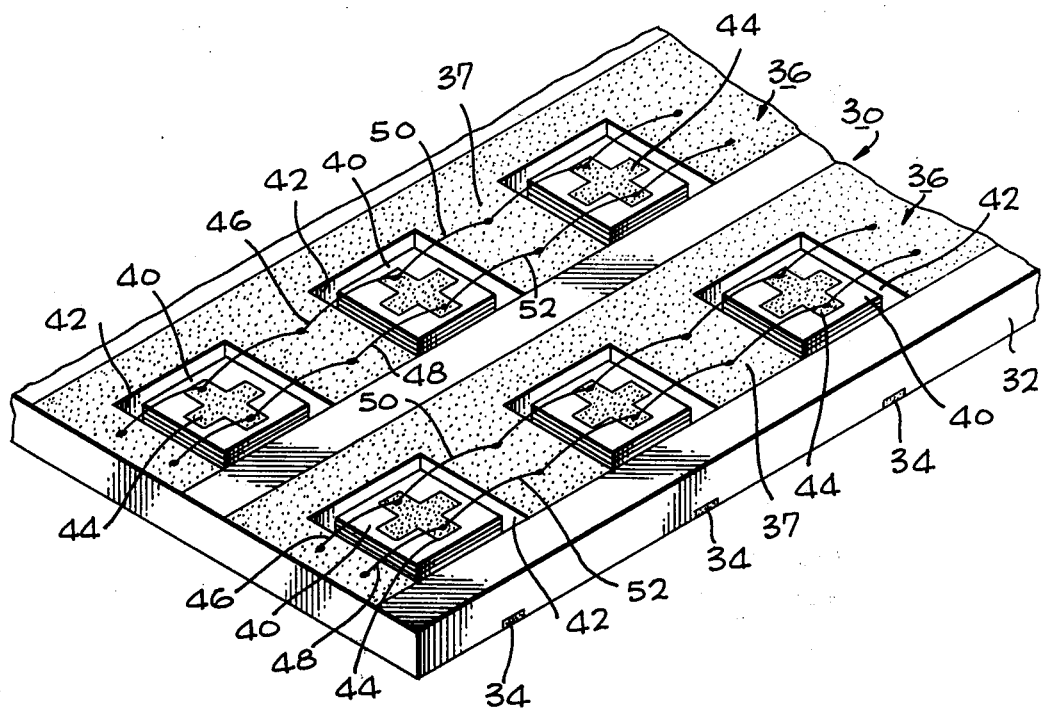

LIGHT EMITTING DIODE ARRAY HAVING A PLURALITY OF CONDUCTIVE PATHS FOR EACH LIGHT EMITTING DIODE

CROSS REFERENCE TO RELATED APPLICATION

This is a continuation of application Ser. No. 492,195 filed July 26, 1974 and now abandoned.

BACKGROUND OF THE INVENTION

The Invention described herein was made in the course of or under a contract or subcontract thereunder with the U.S. Army Electronics Command.

Light emitting diodes (LED) have been described and developed for use in electronic circuits; see U.S. Pat. No. 3,740,570, granted June 19, 1973, and assigned to the same assignee as the present invention. When LEDs are used in an array, each LED must be electrically connected into the array. It is known that such electrical connections are usually a single electrical conductor that is ultrasonically bonded or stitched to any number of LEDs in a string. A single break in the electrical conductor can result in a catastrophic failure of the LED array. In those LED arrays where each LED is individually connected into the array by a single electrical conductor, the loss of integrity of the conductor will result in a loss of the LED. Both situations therefore can reduce the efficiency of the particular LED array.

OBJECTS OF THE INVENTION

Accordingly, it is an object of the invention to provide a new and improved light emitting diode array.

It is an object of the invention to provide a light emitting diode array having increased reliability by reducing the probability of catastrophic failure due to loss of integrity of an electrical conductor.

SUMMARY OF THE INVENTION

Briefly, in accordance with the invention, a new and improved light emitting diode (LED) array is provided having a substrate, a plurality of first electrical conductor strips on the substrate and a plurality of second electrical conductor strips transverse to and spaced from the first strips, a plurality of light emitting diodes positioned along the first and second strips where each LED has direct electrical contact with respective ones of the second strips and each LED has an exposed electrical contact surface, and at least four electrical conductors for each of the LED where the four conductors electrically connect the exposed electrical contact surface of each LED to an associated first electrical conductor strip so that four electrical paths are developed between each LED and the first strip.

While the specification concludes with claims particularly pointing out and distinctly claiming the subject matter which may be regarded as the invention, the organization and method of operation, together with further objects, features, and the attending advantages thereof, may best be understood when the following description is read in connection with the accompanying drawing.

BRIEF DESCRIPTION OF THE DRAWING

The FIGURE is an enlarged, partly broken away, perspective view of one light emitting diode (LED) array of the invention.

DESCRIPTION OF THE INVENTION

One light emitting diode (LED) array 30 of the present invention is shown in the FIGURE having a substrate 32, electrical conductor strips 34 oriented along an x-axis of the substrate and preferably parallel with each other, electrical conductor strips 36 oriented along a y-axis of the substrate and spaced from the strips 34 and preferably parallel with each other, and a plurality of light emitting diodes (LED) 40 positioned along the conductor strips 34 and 36 in a tandem and spaced apart relationship. The conductor strips 36 include extension portions 37 extending between each pair of LEDs 40 associated with a particular conductor strip 36. In the LED array 30, each LED 40 is recessed into the substrate 32 in recesses 42 although this is not critical to the invention. Each LED 40 is in direct electrical contact (not shown but considered to be conventional) with a respective one of the electrical conductor strips 34. Further, each LED 40 has an exposed contact surface 44.

In the LED array 30 of the present invention as shown in the FIGURE, each LED 40 has four electrical conductors, such as wires 46, 48, 50, and 52. Each of the electrical conductor wires are connected between the exposed contact surface 44 and the respective electrical conductor strip 36 associated with the LED 40.

In the LED array 30, a break or other failure in one electrical conductor wire, for example, electrical conductor wire 46, does not destroy the integrity of the electrical path through the LED 40 since any one of the remaining electrical conductor wires 48, 50, and 52 provide the desired electrical path between the exposed contact surface 44 and the adjacent electrical conductor strip 36. In the present invention, a break or failure in three of the four electrical conductor wires does not destroy the integrity of the electrical path since the one remaining electrical conductor wire, for example, electrical conductor wire 52, provides the desired electrical path. It is only when all of the electrical conductor wires fail that the integrity of the electrical path is destroyed; however, the probability of such failure of all the electrical conductors in the present invention is substantially reduced when compared to the similar probability in prior art LED arrays.

As will be evidenced from the foregoing description, certain aspects of the invention are not limited to the particular details of construction as illustrated, and it is contemplated that other modifications and applications will occur to those skilled in the art. It is, therefore, intended that the appended claims shall cover such modifications and applications that do not depart from the true spirit and scope of the invention.

I claim:

1. A light emitting diode array, comprising:
    a substrate;
    a series of first parallel conductor strips on the substrate;
    a plurality of LEDs in electrical contact with each of the first conductor strips;
    a series of second parallel conductor strips on the substrate spaced apart from the first conductor strips and transverse thereto, the second conductor strips including extensions thereof extending between each pair of associated LEDs on adjacent first conductor strips; and
    wire bond conductors stitched bonded from each LED to the second conductor strip extension adjacent thereto and then to the next adjacent LED.

* * * * *